(12) United States Patent
Kulkarni et al.

(10) Patent No.: US 9,363,930 B2
(45) Date of Patent: *Jun. 7, 2016

(54) PASSIVE TWO PHASE COOLING SOLUTION FOR LOW, MEDIUM AND HIGH VOLTAGE DRIVE SYSTEMS

(71) Applicant: TECO-Westinghouse Motor Company, Round Rock, TX (US)

(72) Inventors: Devdatta P. Kulkarni, Austin, TX (US); Thomas Keister, Georgetown, TX (US)

(73) Assignee: TECO-Westinghouse Motor Company, Round Rock, TX (US)

( * ) Notice: Subject to any disclaimer, the term of this patent is extended or adjusted under 35 U.S.C. 154(b) by 797 days.

This patent is subject to a terminal disclaimer.

(21) Appl. No.: 13/792,936

(22) Filed: Mar. 11, 2013

(65) Prior Publication Data

US 2014/0252864 A1 Sep. 11, 2014

(51) Int. Cl.
*H02J 1/00* (2006.01)
*H05K 7/20* (2006.01)
*F28D 15/02* (2006.01)

(52) U.S. Cl.
CPC ........ *H05K 7/20936* (2013.01); *F28D 15/0266* (2013.01); *Y10T 307/707* (2015.04)

(58) Field of Classification Search
CPC ....................................................... H02J 1/102
USPC ............................................................ 307/82
See application file for complete search history.

(56) References Cited

U.S. PATENT DOCUMENTS

| | | |
|---|---|---|
| 3,581,212 A | 5/1971 | McMurray |
| 3,641,419 A | 2/1972 | Koltuniak et al. |
| 3,659,239 A | 4/1972 | Marton |
| 3,749,981 A | 7/1973 | Koltuniak et al. |
| 3,867,643 A | 2/1975 | Baler |
| 4,052,657 A | 10/1977 | Kleiner |
| 4,342,002 A | 7/1982 | Gabr |
| 4,674,024 A | 6/1987 | Paice et al. |
| 5,239,128 A | 8/1993 | Golden et al. |
| 5,289,363 A | 2/1994 | Ferchau et al. |

(Continued)

FOREIGN PATENT DOCUMENTS

CN 1427521 7/2003

OTHER PUBLICATIONS

Jeremy C. Howes, et al., "Cooling of an IGBT Drive System with Vaporizable Dielectric Fluid (VDF)," Prker Hannifin Corporation, 2008, 4 pages.

(Continued)

*Primary Examiner* — Stephen W Jackson
(74) *Attorney, Agent, or Firm* — Trop, Pruner & Hu, P.C.

(57) ABSTRACT

In an example embodiment, a cooling system is a pumpless passive system, and includes a cold plate configured to receive a flow of liquid coolant and to output a flow of vapor phase coolant, where the cold plate includes at least one heat pipe adapted therein to provide for transfer of the liquid coolant to the vapor phase coolant, a first connection member coupled to the at least one heat pipe, a first conduit coupled to the first connection member, the first conduit extending vertically to enable at least the vapor phase coolant to travel through the first conduit, and a heat exchanger located above and coupled to the first conduit, where the heat exchanger is to transfer the vapor phase coolant to the liquid coolant.

19 Claims, 3 Drawing Sheets

(56) References Cited

U.S. PATENT DOCUMENTS

| | | | |
|---|---|---|---|
| 5,619,407 | A | 4/1997 | Hammond |
| 5,625,545 | A | 4/1997 | Hammond |
| 5,638,263 | A | 6/1997 | Opal |
| 5,734,565 | A | 3/1998 | Mueller et al. |
| 5,816,313 | A * | 10/1998 | Baker ............... F16K 15/048 137/519.5 |
| 5,986,909 | A | 11/1999 | Hammond |
| 6,005,788 | A | 12/1999 | Lipo et al. |
| 6,014,323 | A | 1/2000 | Aiello |
| 6,031,738 | A | 2/2000 | Lipa |
| 6,166,513 | A | 12/2000 | Hammond |
| RE37,128 | E | 4/2001 | Peng |
| 6,229,722 | B1 | 5/2001 | Ichikawa et al. |
| 6,236,580 | B1 | 5/2001 | Aiello et al. |
| 6,262,555 | B1 | 7/2001 | Hammond |
| 6,269,000 | B1 | 7/2001 | McCarrol |
| 6,320,767 | B1 | 11/2001 | Shimoura et al. |
| 6,340,851 | B1 | 1/2002 | Rinaldi |
| 6,377,478 | B1 | 4/2002 | Morishita |
| 6,508,301 | B2 * | 1/2003 | Marsala ............... F25B 39/022 165/104.33 |
| 6,519,955 | B2 * | 2/2003 | Marsala ............... F25B 23/006 165/80.4 |
| 6,563,410 | B1 | 5/2003 | Marton |
| 6,621,719 | B2 | 9/2003 | Steiner et al. |
| 6,653,744 | B2 | 11/2003 | Stricker |
| 6,679,081 | B2 | 1/2004 | Marsala |
| 6,697,271 | B2 | 2/2004 | Corzine |
| 6,853,541 | B2 | 2/2005 | Anheuer et al. |
| 6,898,095 | B2 | 5/2005 | Bijlenga et al. |
| 7,164,201 | B2 | 1/2007 | Manz |
| 7,190,070 | B2 | 3/2007 | Manz et al. |
| 7,242,584 | B2 | 7/2007 | Kroneder |
| 7,307,361 | B1 | 12/2007 | Bendre et al. |
| 7,319,594 | B2 | 1/2008 | Nicolai et al. |
| 7,423,892 | B2 | 9/2008 | Vinciarelli |
| 7,479,757 | B2 | 1/2009 | Ahmad |
| 7,705,553 | B2 | 4/2010 | Worrall |
| 7,876,561 | B2 | 1/2011 | Schnetzka et al. |
| 7,892,670 | B2 | 2/2011 | Aiello et al. |
| 7,940,537 | B2 | 5/2011 | Abolhassani |
| 8,130,501 | B2 | 3/2012 | Ledezma |
| 8,254,076 | B2 | 8/2012 | Ledezma |
| 8,279,640 | B2 | 10/2012 | Abolhassani |
| 8,451,589 | B2 | 5/2013 | Milovac et al. |
| 8,760,855 | B2 | 6/2014 | Howes et al. |
| 8,902,034 | B2 | 12/2014 | MacLennan |
| 8,976,526 | B2 * | 3/2015 | Kulkarni ............... H02M 7/003 307/10.6 |
| 9,153,374 | B2 | 10/2015 | Kulkarni et al. |
| 2008/0079314 | A1 | 4/2008 | Hammond |
| 2008/0081244 | A1 | 4/2008 | Hammond |
| 2008/0088186 | A1 | 4/2008 | Hammond |
| 2008/0196444 | A1 | 8/2008 | Lawes |
| 2009/0021922 | A1 | 1/2009 | Popp |
| 2009/0038780 | A1 | 2/2009 | Liu |
| 2009/0158757 | A1 | 6/2009 | Marsala |
| 2009/0229283 | A1 | 9/2009 | Marsala |
| 2010/0073970 | A1 | 3/2010 | Abolhassani et al. |
| 2011/0044010 | A1 | 2/2011 | Ledezma et al. |
| 2011/0292604 | A1 | 12/2011 | Janes |
| 2011/0315354 | A1 | 12/2011 | Johnson |
| 2012/0044032 | A1 | 2/2012 | Sathe et al. |
| 2012/0127673 | A1 | 5/2012 | Ledezma, et al. |
| 2012/0230843 | A1 | 9/2012 | Ravipati et al. |
| 2012/0327602 | A1 | 12/2012 | Kulkarni |
| 2014/0252864 | A1 | 9/2014 | Kulkarni et al. |

OTHER PUBLICATIONS

Dr. Keith Corzine, "Operation and Design of Multilevel Inverters," Dec. 2003, pp. 1-79.

U.S. Patent and Trademark Office, Notice of Allowance mailed Nov. 6, 2014 in U.S. Appl. No. 13/606,526.

* cited by examiner

PASSIVE TWO PHASE COOLING SOLUTION FOR LOW, MEDIUM AND HIGH VOLTAGE DRIVE SYSTEMS

BACKGROUND

Generally, equipment referred to as a power converter, inverter or drive is used to provide power to another piece of equipment such as a motor. Specifically, such a converter (converter is used generally herein to refer to converters, inverters and drives) is coupled to a utility connection to receive incoming input power such as three-phase AC power. The converter conditions the power to provide a conditioned power to the equipment or load. In this way, incoming power to the load may be of improved efficiency, leading to reduced costs to operate the equipment.

Multi-level power converters have been gaining popularity mainly due to improved input and output harmonics content, better electromagnetic compatibility, and higher voltage capability. These improvements in power conversion are achieved by using a multiple voltage step strategy. One common multi-level inverter topology is based on H-bridge inverters, in which multiple H-bridge inverters are connected in series. Since this topology consists of series power conversion cells, the voltage and power level may be easily scaled.

Multi-level power converters are used to provide power to a load such as a motor. Oftentimes, such multi-level converters are implemented as a large piece of equipment that is housed in a cabinet that receives incoming power, e.g., from a utility connection, conditions the power and provides it to a coupled load. In general, a drive system includes one or more transformers that have secondary windings that are coupled to individual power cells that perform rectification, inversion, and other conditioning tasks. Typically, to perform these functions each power cell includes a rectifier, DC link capacitor and inverter, among other such equipment, and each such power cell is packaged together into a module.

However, as voltage and power requirements increase in a system, these modules can be relatively cumbersome, bulky and expensive. For example, in medium voltage (MV) applications, such power cells can easily exceed 50 pounds due to the size of the DC link capacitors and other components present. Another drawback of this conventional design of power cells of a drive system includes a costly and complex customized isolation system as voltage levels increase from a few kilovolts to tens of kilovolts. In general, power cells are provided as a fixed enclosed module customized for a given power and voltage level. For example, power cells for 4160V at 1000 HP applications will radically increase foot print and weight over a power cell designed for 3300V at the same output power. In addition, the overall MV converter package must be individually designed to meet a particular power output, such as 5000 HP, 10000 HP, 20000 HP applications, control, and protection specifications.

In current medium voltage drives, a cascaded topology is implemented using a partial modular design. Specifically, the only subcomponent of the system that is common across drive products of a family is the power cell, which as described above contains the power components including inverter, rectifier, and DC-link. Current medium voltage drives have excluded all other system components, including transformers, control, cooling system, communication distribution, packaging, and electrical insulation, from a modular approach. Instead, these major components are optimized for voltage and power rating of a specific design and thus are not easily transferable to other drive ratings.

Many drive systems are provided with an air-based or water-based cooling system. While suitable for many applications, such systems suffer from high costs, reduced efficiency, and size limitations.

SUMMARY OF THE INVENTION

In an example embodiment, a cooling system is a pumpless passive system, and includes a cold plate configured to receive a flow of liquid coolant and to output a flow of vapor phase coolant, where the cold plate includes at least one heat pipe adapted therein to provide for transfer of the liquid coolant to the vapor phase coolant, a first connection member coupled to the at least one heat pipe, a first conduit coupled to the first connection member, the first conduit extending vertically to enable at least the vapor phase coolant to travel through the first conduit, and a heat exchanger located above and coupled to the first conduit, where the heat exchanger is to transfer the vapor phase coolant to the liquid coolant.

The cold plate may include multiple heat pipes each including a channel adapted to communicate the liquid coolant along a path to enable heat exchange with a switching device coupled to the corresponding cold plate. The heat pipe(s) also may include a wick structure to communicate the liquid coolant from the heat exchanger.

In another aspect, a cooling system for a drive system includes a cold plate configured to receive a flow of liquid coolant and to output a flow of vapor phase coolant, where the cold plate includes at least one heat pipe adapted therein to provide for transfer of the liquid coolant to the vapor phase coolant, a first manifold coupled to the cold plate, a first flexible conduit coupled to the first manifold and which extends vertically to enable the liquid coolant and the vapor phase coolant to travel through the first flexible conduit, and a heat exchanger located above and coupled to the first flexible conduit. The heat exchanger is to transfer the vapor phase coolant to the liquid coolant, where both the vapor phase liquid coolant travels passively through the cold plate, the first manifold, the first flexible conduit and the heat exchanger.

Yet another aspect is directed to a medium voltage drive system having at least one transformer with at least one primary winding to receive power from a utility connection and at least one secondary winding, power cubes each coupled to the at least one secondary winding and including a rectifier, a DC-link, and an inverter, where each power cube includes at least one cold plate coupled to one or more switching devices of the inverter, and a port. A manifold assembly is coupled to the at least one cold plate of the power cubes, a first flexible conduit is coupled to the manifold assembly and extends vertically to enable the liquid coolant and the vapor phase coolant to travel through the first flexible conduit, and a heat exchanger is located above and coupled to the first flexible conduit. The heat exchanger is to transfer the vapor phase coolant to the liquid coolant, where the liquid coolant and the vapor phase coolant passively flow through the system.

DETAILED DESCRIPTION

Embodiments may be used to provide a passive multiple phase liquid cooling solution for thermal management of power electronics in low, medium and high voltage drive systems, among other fields. More specifically, an advanced heat loop design is provided where a fluid/refrigerant is circulated through the loop using vapor pressure generated inside an evaporator, which in an embodiment can be implemented as one or more heat pipes embedded within a heat absorbing member. In some implementations, the evaporator can have an advanced wick structure to provide a continuous flow of liquid fluid/refrigerant to the evaporator without using any pump or compressor in the loop. The fluid in the evaporator boils off after absorbing the heat transferred to the evaporator, which in turn generates pressure. The pressure generated by the vapor forces the vapor phase of refrigerant into a condenser, where the vapor is cooled externally by flowing air or liquid over it. The gases are thus condensed in the condenser and returned to the inlet of the evaporator using vapor pressure as well as gravity.

In various embodiments, a passive multiple phase cooling system may be provided for use in connection with various types of electronic equipment. More particularly embodiments described herein are used in connection with a drive system such as a medium voltage drive system. However it is understood that embodiments are not so limited and other embodiments can be implemented in a low voltage drive system, a high voltage drive system or a motor system, among other types of equipment that require cooling. As used herein, the term "passive" is used to mean a mulitple-phase cooling system in which no pump is present, in other words a pumpless system in which no active energy is required to drive the fluid and gases inside the loop. By providing a pumpless system, benefits of reduced implementation size, cost, complexity and the potential for failures all can be improved, i.e., reduced.

Figure 1A:
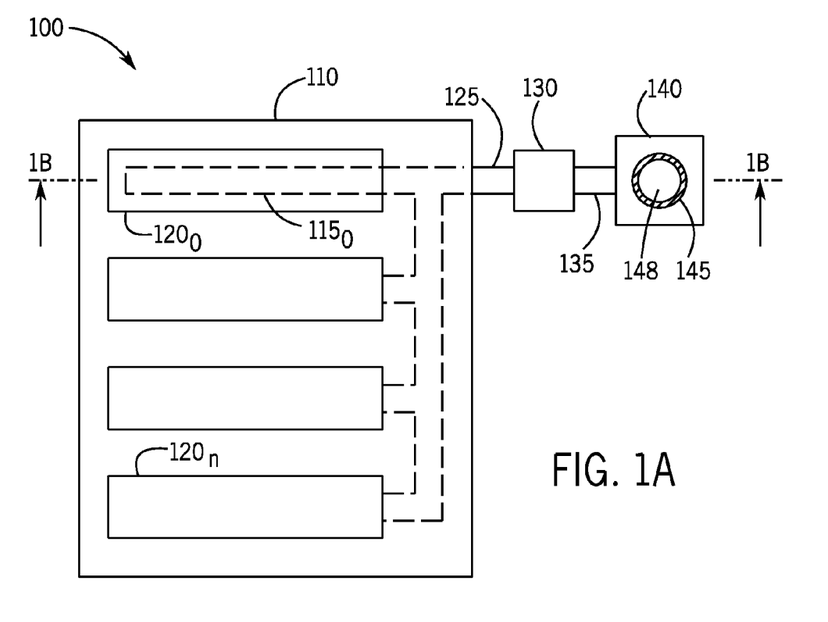
FIG. 1A is a top view of a portion of a cooling system in accordance with an embodiment of the present invention.

Referring now to FIG. 1A, shown is a top view of a portion of a cooling system in accordance with an embodiment of the present invention. In the embodiment of FIG. 1A, cooling system 100 is used for cooling components of a medium voltage drive system. For example, a cold plate 110 is configured to support a plurality of insulated gate bipolar transistors (IGBTs) $120_0$-$120_n$. Of course while shown as supporting and cooling these components, understand that additional and/or different components may be cooled using a cold plate or other heat absorbing component of a cooling system. As an example, cold plate 110 may be formed of an appropriate metal material such as copper, aluminum or another suitable heat absorbing material. As seen in the phantom illustration in FIG. 1A, a heat pipe $115_0$ may be implemented within cold plate 110 under at least a portion of IGBT $120_0$. As will be described herein, heat pipe $115_0$ may provide for a transfer of heat from the IGBT to a heat dissipation component of the cooling system (not shown for ease of illustration in FIG. 1A). To this end, heat pipe $115_0$ may couple to a conduit 125 that in turn is coupled to a first connection structure 130, which in an embodiment may be a quick disconnect adapter that enables ease of coupling cold plate 110 within the cooling system.

In turn a second conduit 135 may be provided that couples to an isolation block 140, which in an embodiment may be implemented as an adiabatic section of the loop, i.e., a non-heat transfer area. In turn a vertical portion of the cooling system may extend upwardly from isolation block 140. In various embodiments, this vertical structure may be configured as flexible tubing, copper pipe or other communication member. Conduit 145 has a cross-section shown in FIG. 1A and more particularly includes a wick structure 148 within at least part of its height to enable transfer of cooling liquid as described further below. Wick structure 148 enables transfer of the cooling liquid by way of a capillary effect. In this embodiment, a single isolation block is provided per cold plate, on which a plurality of IGBTs or power electronics are mounted. Each cube is floating in voltage. This isolation block is provided per cube basis, in an embodiment. However in another embodiment a heat pipe associated with each of the IGBTs may couple to independent quick disconnects and isolation blocks.

In other embodiments, a manifold mechanism may be provided to reduce the number of components that couple the heat pipes within cold plate 110 to a heat dissipation component of the cooling system. Also, note that a cooling system will typically include multiple cold plates each associated with different heat generating devices. As one example, a plurality of cold plates of a power cube can be coupled together generally such that a flow of cooling liquid enters a first cold plate and exits a last of the cold plates in a vapor phase. In operation each of these cold plates may be maintained substantially isothermally. As another example, the fluid enters into a single large cold plate from one side of a manifold and goes out of the cold plate as a vapor phase into the outlet manifold.

Note that by providing heat pipes within the cooling plate, the need for an accumulator or other reservoir structure to store liquid coolant can be avoided. That is, these heat pipes within the cold plates may act as accumulators to maintain a suitable supply of the liquid coolant, which in operation is heated and transferred to a vapor phase.

In one embodiment, heat pipes 115 may be machined into cold plate 110 via an appropriate machining process. In an example embodiment the heat pipes may have a diameter of between approximately 0.1 and 3 centimeters. However other manners of forming the heat pipes are possible. For example, a cold plate may be fabricated using two separate plates, each of which has generally semicircular grooves formed therein. Next a solder material is provided within these grooves and the two halves are joined together and undergo a heating process to thus form the heat pipes from the solder material. Other manners of forming the heat pipes include having a groove drilled in the cold plate and inserting the heat pipes in each groove. The area between the cold plate and heat pipe may be filled up with soldering material or high thermal conductivity material such as thermal pastes.

In an embodiment, each heat pipe may include a wick structure to enable fluid to enter the evaporator section and the core of the heat pipe allows the vapor to collect and exit the heat pipe and flow into the condenser section of the heat pipe loop. In an embodiment, the wick structure may be implemented as fine metal particles fused to the inner surface of the tube or as a mesh insert within the heat pipe. In some embodiments this mesh insert may be formed of an appropriate metal such as cooper, titanium, aluminum or other such metal or other material. In some embodiments, a unitary wick structure extending from within the heat pipe through intervening connection structures (except the isolation block) and into conduit 145 may be present to allow the vapor to flow up towards heat exchanger 150. In the isolation block, a mesh of non-metal such as wool can be used, which has high dielectric properties.

Figure 1B:
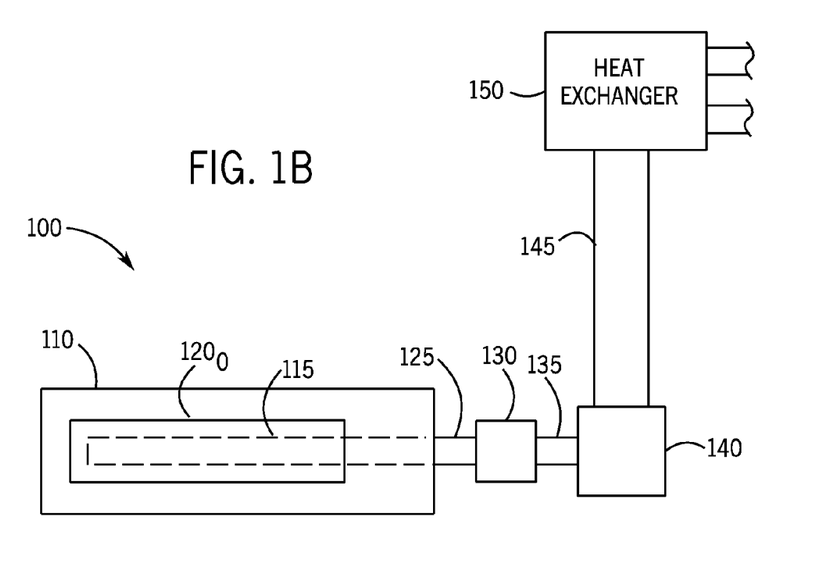
FIG. 1B is a cross section of a portion of a cooling system in accordance with an embodiment of the present invention.

Referring now to FIG. 1B shown is a cross section along arrows A/A' of FIG. 1A. As seen in this view of the cooling system, conduit 145 couples to a heat exchanger 150. In various embodiments, heat exchanger 150 may be an air-based or liquid-based heat exchanger. By providing a pumpless two phase system, note that only a single port with heat exchanger 150 is needed per conduit. And similarly only a single port with the heat pipes is also present per conduit. This benefits the cooling system by providing fewer connections and fittings, as well as reducing the potential for leaks or other reliability issues with regard to these coupling points.

Cooling system 100 may operate such that when heat is to be dissipated, the heat absorbed within cold plate 110 is removed by the two phase mixture of liquid and vapor within the cooling system. More specifically, this coolant may be pure water-based (with high dielectric constant) or it can be a refrigerant such as R-134a which has very high dielectric properties. When the liquid coolant is heated, it transforms into vapor, absorbing all the latent heat, which passes out of heat pipe 115 and through the conduit structure and upwardly through conduit 145 and into heat exchanger 150, which performs heat dissipation by cooling this vapor phase with an appropriate coolant (air or liquid), causing the vapor phase to return to a liquid phase. In turn, this liquid transformed in heat exchanger 150 returns downwardly through conduit 145 back into heat pipe 115. In certain implementations, as discussed above one or more wick structures within the heat pipe and/or conduits enable the liquid coolant to be communicated from the heat exchanger.

Note that wick structure 148 may be configured within the conduit such that vapor flows upward through the wick structure, which is adapted within an interior portion of the conduit. In turn, the cooled liquid coolant flowing back towards the cold plates may flow downwardly at an axial perimeter of the conduit.

Although shown with this particular implementation in FIGS. 1A and 1B, understand that a passive cooling system as disclosed herein can be configured in other manners. For example, other embodiments may provide for an implementation that avoids the use of certain components. As one example, rather than providing isolation blocks, a flexible tubing used as the conduit to the heat exchanger can directly couple to a quick disconnect or other connection member, avoiding the need for an isolation block. Of course still other variations are possible in other embodiments.

Figure 2:
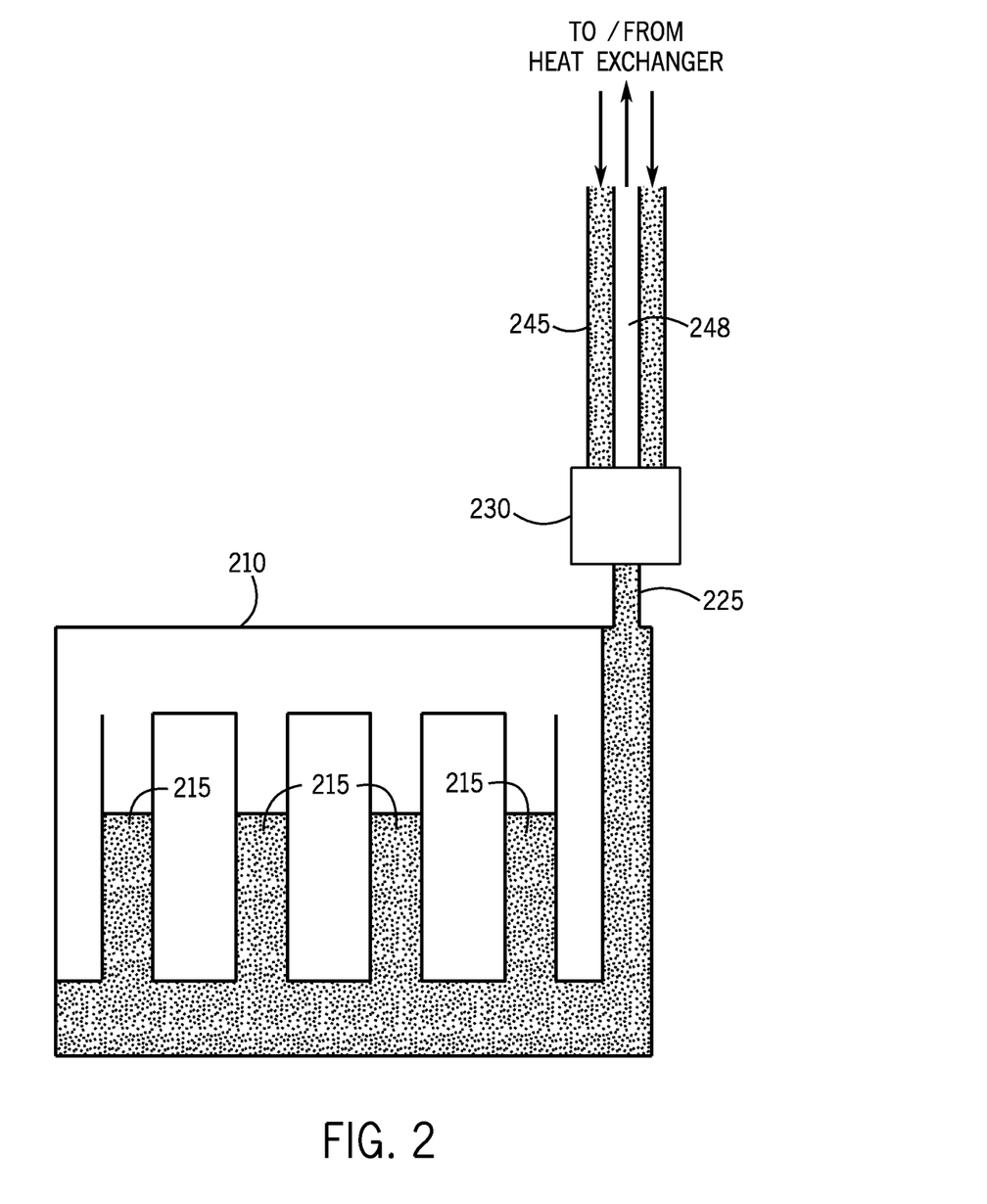
FIG. 2 is a block diagram of a portion of a cooling solution in accordance with another embodiment of the present invention.

Referring now to FIG. 2, shown is a block diagram of a portion of a cooling solution in accordance with another embodiment of the present invention. FIG. 2 shows a multi-dimensional structure. That is, an evaporator 210 may be configured in a generally horizontal arrangement (not as shown in FIG. 2) while the remainder of the cooling solution is generally in a vertical configuration. To show details of both parts, however, evaporator 210 is shown vertically in FIG. 2. Evaporator 210 has a plurality of fluid channels 215, each implemented by way of a heat pipe. As seen, a single conduit 225, which may be implemented as a quick disconnect, provides an output for a flow of heated vapor as well as an inlet for cooled liquid, although in other embodiments, separate conduits are possible. In the embodiment shown, conduit 225 feeds into an isolation block 230. In turn, this isolation block is coupled to a conduit 245 which in an embodiment may be a flexible tubing to enable easy installation in a given drive system. As seen, conduit 245 includes a wick structure 248 which thus provides in a downward manner liquid coolant to flow into evaporator 210 without the need for a pump or other active measure. Note that the flow of vapor may travel upward to a condenser or other heat exchanger unit to enable the liquid coolant to be recovered. With this single phase vapor flow in one direction and liquid coolant travelling in the other direction, a passive system is realized.

Figure 3:
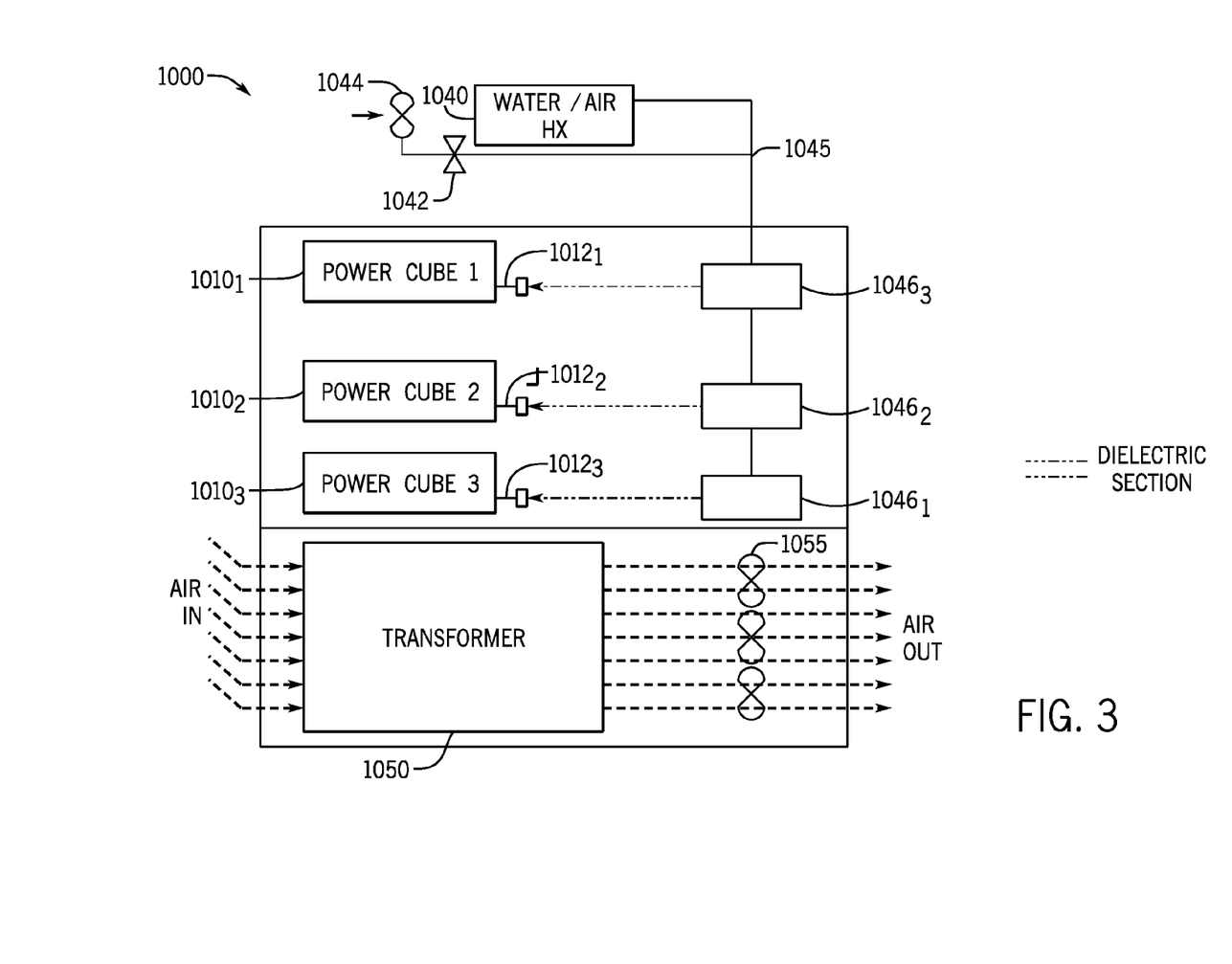
FIG. 3 is a block diagram of a single slice of a drive system that can be cooled in accordance with an embodiment of the present invention.

Referring now to FIG. 3, shown is a block diagram of a single slice of a drive system 1000 that can be cooled in accordance with an embodiment of the present invention. In FIG. 3, the portion of drive system 1000 shown may be a single slice that includes a plurality of power cells or cubes 1010$_1$-1010$_3$ (generically power cube 1010). Each of these power cubes can be configured as described in U.S. Pat. No. 8,130,501, the disclosure of which is hereby incorporated by reference, with each cell configured within a given chamber and including a movable portion and a fixed portion. Or, a unitary power cube design in which the entire power cube is movable may instead be provided. However, understand the scope of the present invention is not limited in this regard. For example, in other embodiments rack mounted power cubes can be provided that can be plugged into a backplane or other supporting mechanism within a cabinet. In any event, the cubes may be inserted in corresponding chambers of an electronics or power cube bay of a cabinet. Given the cooling capabilities of a cooling system in accordance with an embodiment of the present invention, this cabinet may be an enclosed NEMA-4 cabinet (at least for the electronics or power cube bay portion), improving reliability and reducing heat transfer with an ambient environment.

Note that the illustration shown in FIG. 3 is at a high level to show the components involved in a cooling system for a single slice implementing be a (vaporizable dielectric fluid (VDF)-based cooling system. Specifically, each power cube 1010 may include one or more cold plates or other heat transfer members including the evaporator section of heat pipe loop as described herein that acts as an evaporator to receive a flow of cool fluid to remove heat from components within the power cube and provide a vapor phase to a remainder of the cooling system.

In the embodiment shown, the cooling system can include a heat exchanger 1040 which in an embodiment may be an air-based heat exchanger such as a condenser that cools the heated high pressure vapor and fluid with an ambient air source that may be directed via a fan 1044. Also note the presence of a condensate control valve 1042 on the secondary heat exchanger line, i.e., a fan or water supply, to avoid any moisture condensation on high power electronics, cold plates and cooling system components such as tubing, etc. Such a condensate control valve may be included in the various cooling loops of a drive system to avoid any moisture accumulation on cold plates, which are in intimate contact with high power electronic components, and on any cooling lines to avoid catastrophic failures.

In other embodiments, this heat exchanger can be a water-based heat exchanger or another fluid-based heat exchanger. In general, heat exchanger 1040 may operate by cooling the heated vapor and fluid to thus reduce its temperature and pressure and provide a flow of liquid coolant back to the power cubes via the same conduit 1045 that it receives the heated vapor. Although shown being located externally to the cabinet, understand that in other embodiments the heat exchanger may be located within the cabinet.

In an embodiment, combined inlet/outlet conduit 1045 can be a combination of a dielectric hose section (generally shown in FIG. 3 as dotted lines) such as thermoplastic hoses, copper or other tubing or so forth. There is at least one section of dielectric part from the power cubes to the conduit to isolate the floating voltages between the power cubes of a medium voltage drive system. A cooling system in accordance with an embodiment of the present invention can isolate up to or more than 13.8 kV isolation.

Note that in the embodiment shown, each power cube 1010 may include a single inlet/outlet port 1012$_1$-1012$_3$, which may be provided with quick disconnect fitting to enable rapid and independent connection/disconnection of a given power cube to/from the cooling system such that a given power cube can be dynamically inserted/removed during normal system operation without an effect on the remainder of the system. Still further, in some embodiments, these ports may be received via blind mating connections to enable easy manual insertion and disconnection. By using dielectric hoses, electrical isolation (e.g., up to 35 kV) between hose-to-hose (i.e., line-to-line) can be realized, and also between power cube to manifold, which is grounded (i.e., line to neutral). This in turn helps to maintain isolation between adjacent power cubes. Of course, separate inlet and outlet ports may be provided in other embodiments.

After cooling the components within a given power cube, the heated vapor may exit via a corresponding port 1012$_1$-1012$_3$ and via a conduit to further portions of the cooling system. Then via an isolation block 1046, heated vapor may travel to heat exchanger 1040. In certain embodiments, a manifold assembly may be present to support routing of the conduits and enable connection of ports 1012 to corresponding ports or other connection members adapted within this manifold assembly and coupled to conduit 1045, either directly or via isolation block 1046. However, this manifold assembly is not illustrated in FIG. 3 so as to not obscure other details shown. Note that most joints can be brazed, which improves reliability of the cooling system and shock tolerance. In an embodiment a minimum of one disconnect is used: between a power cube and blind mate connections.

As further shown in FIG. 3, a modular transformer 1050 may be present and coupled to the power cubes. In various embodiments, this modular transformer may be configured as discussed above. Transformer 1050 may be cooled by a flow of incoming air, e.g., being directed by fans 1055 or other extraction mechanism to enable the transformer to be cooled and allow a heat exchange to occur such that a flow of heated air exits the transformer. In some implementations, multiple fans may be provided for transformer cooling. The fan motors may be controlled responsive to a variable frequency drive (VFD). In this way the fan speed can be maintained proportionally to air flow rate and likewise to the transformer winding temperature. Also, by using VFD in combination with a separate fan for each winding, the temperature of each winding can be controlled separately, allowing greater control on winding performance. Although shown at this high level in the embodiment of FIG. 3, understand the scope of the present invention is not limited in this regard.

Embodiments may use the heat of vaporization (flow boiling). This VDF-based cooling is isothermal, and can be plumbed in a serial manner to different cold plates in the power cubes, such that all cold plates in that power cube may be maintained at substantially the same temperature. Each power cube is floating in terms of voltage with respect to others. When fluid passes from manifold to power cube or vice versa, at least one dielectric section of hoses or conduit is provided. All power cubes then can be connected in series or parallel. Evaporative heat transfer in accordance with an embodiment of the present invention can be 2×-4× better than single-phase (e.g., water) convective heat transfer coefficients.

In different embodiments, any vaporizable dielectric can be used. As examples, R134-a or low pressure refrigerants can be used, which flash to gas at ambient pressures. These various refrigerants are dielectric and will not harm the electronics in case of leakage occurs, and further cause no corrosion or scaling. Note that the dielectric fluid can be interchanged according to the site location and its respective local environmental codes.

In a VDF system, a liquid-to-gas phase change of a refrigerant such as R134-a occurs within the evaporator such as a cold plate. As long as there is fluid in the cold plate, the cold plate surface will be held close to the boiling point of the fluid. In an example embodiment, for 40° C. refrigerant, 151 J are required to convert 1 g of refrigerant from liquid to gas. Therefore, to dissipate 1 kW of power, a flow rate of 0.43 lit/min is required, in contrast to much higher flow rates for a water-based system. Lower flow rates for a VDF system mean that a pumpless system as described herein can be used. And by using a pumpless flow of fluid, there is no parasitic load on the cooling system, thus improving efficiency of a medium voltage drive system. Also the overall size and weight of the drive system is reduced as compared to a water cooled system.

Using a dielectric fluid that vaporizes easily at ambient pressures, many positive attributes adhere including safety, operating temperatures, heat of vaporization for optimum performance, minimum volumes, lubrication and component reliability, and materials compatibility. Dielectric fluids in accordance with an embodiment have excellent compatibility with many metals including copper, aluminum, brass, bronze, with set galvanic action from combinations of metals and thus no ionic stripping or transport or galvanic action occurs. In various embodiments self-optimizing system performance for VDF cooling technology may be as follows. In general, sub-cooled fluid enters and flows down via vertical conduits in a 100% liquid phase. Liquid flows into cold plates within each of power cubes 1010. Sensible heat transfer occurs in the cold plates, causing fluid flow to boil to a predetermined liquid/vapor percentage. Next a vapor phase flows via isolation blocks 1046 (where present) and conduits 1045 from the cold plates to heat exchanger 1040, which dissipates heat to the cooling fluid medium (air, water, etc.) and condenses to liquid. Vapor thus enters the condenser where heat is released and the mixture condenses to liquid. Sub-cooling occurs via sensible heat transfer, reducing temperature of liquid to ensure 100% liquid again flows downward via vertical conduits, and the cycle repeats.

As load increases, the system moves further into the vapor dome, but design parameters may be set to size it so cold plates never dry out. As the load decreases, the system boils less. There are no penalties in this in terms of cold plate temperatures because fluid flows are low, as the system reacts quickly to varying power levels and fluid flow is constant. Using a two-phase cooling system, a higher horsepower rating can be achieved, realizing more power density while reducing unit cost of cooling. Other cost benefits may include: more electronics reliability due to less thermal switching; less maintenance as the external air does not enter the electronics section (e.g., when using a NEMA-4 enclosure); less heat load on a HVAC system when a drive system is installed inside a building; the drive can go from zero to full rating without having any thermal issues (i.e., very small time constant for cooling); and can have an option of air and water cooled with the same system.

Other embodiments besides the externally located heat exchanger implementation shown in FIG. 3 are possible. For example, in another embodiment multiple heat exchangers may be provided to enable greater cooling operation. A choice of a single or multiple heat exchange system may be based on a location of the drive system. For example, when it is desirable to limit the amount of heat exchange into an ambient environment such as a room in which a drive system is located, it is possible to include a water-based heat exchanger within the drive system itself that in turn can be coupled to an external heat exchanger, which in various implementations can be a water or air-based heat exchanger. Note that the number of heat exchangers depends also upon customer specifications such as availability of a cold water tower, HVAC limitations for the room, size of installation site, and cost for each additional heat exchanger system and so forth.

As with the drive system itself, the cooling system components within the power cubes are also modular and can be replaced quickly in case of failures. Also, the cooling system is modular with each slice. If a customer needs to add more rating in the drive, there is no need to custom design the cooling system for the whole drive system. And as such the slice cooling system can allow mass production of the cooling system independently of the rating of the drive. Cooling systems described herein may be used for regenerative as well as non-regenerative low, medium and high voltage drive systems and other devices requiring cooling.

Each power cube with multiple power electronics or evaporators may be floating at high voltages. The hot vapor is collected into the manifolds which are electrically isolated from each power cube using electrically non-conductive refrigerant hoses. Each evaporator may operate at different heat loads at the same time without affecting the thermal performance. In this way, the cooling system is more robust and reliable than pumped cooling. Since there are no moving parts, the system is passive, i.e., no need for external power. In addition, the system is vibration tolerant and easy to install. Using an embodiment, the power electronics section of a drive system can be NEMA-4 enclosure type, i.e., having no ambient air contamination with inside air.

Two phase liquid cooling scheme offers better thermal performance for thermal management of power electronics in low, medium and voltage drives. This system is passive, i.e., no need for power to drive fluid internally. The electrical isolation to withstand the floating voltage of the drive is provided by nonconductive refrigerant grade hoses or dielectric material blocks made up of fiberglass (G10, Torlon™, Formex™, etc.). The cooling system is self priming and self adjustable to the heat load. A more reliable cooling system results as there are no moving parts. The fluid may be circulated using capillary pressure generated in the evaporator, vapor pressure and gravity aided. The enclosure for the power electronics of a drive system can be NEMA-4 type. The installation of cooling system is easy. The condenser of the drive system can be air or liquid cooled. The cooling system is vibration tolerant to shock, and may be able to handle higher ambient temperatures as well.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A cooling system for a drive system comprising:
   a cold plate configured to receive a flow of liquid coolant and to output a flow of vapor phase coolant, the cold plate including at least one heat pipe adapted therein to provide for transfer of the liquid coolant to the vapor phase coolant;
   a first connection member coupled to the at least one heat pipe;
   a manifold assembly to couple the cold plate to a first conduit;
   the first conduit coupled to the first connection member, the first conduit extending vertically to enable at least the vapor phase coolant to travel through the first conduit; and
   a heat exchanger located above and coupled to the first conduit, wherein the heat exchanger is to transfer the vapor phase coolant to the liquid coolant.

2. The cooling system of claim 1, wherein the cold plate comprises a plurality of heat pipes each including a channel adapted to communicate the liquid coolant along a path to enable heat exchange with a switching device coupled to the corresponding cold plate.

3. The cooling system of claim 1, wherein the at least one heat pipe comprises a wick structure to communicate the vapor phase coolant to the first conduit.

4. The cooling system of claim 1, wherein the first conduit comprises a wick structure to communicate the liquid coolant from the heat exchanger.

5. The cooling system of claim 4, wherein the wick structure is axially adapted in the first conduit, and the liquid coolant is communicated to the at least one heat pipe axially outwardly from the wick structure.

6. The cooling system of claim 1, wherein the at least one heat pipe comprises an accumulator for the liquid coolant.

7. The cooling system of claim 1, wherein the liquid coolant is circulated via capillary pressure, vapor pressure, and gravity.

8. The cooling system of claim 1, wherein the first conduit comprises a flex tube.

9. The cooling system of claim 1, wherein the cooling system comprises a pumpless passive system.

10. The cooling system of claim 1, wherein the first connection member comprises a blind mating connection to mate with a corresponding port of the cold plate.

11. The cooling system of claim 1, further comprising a first isolation block coupled between the first connection member and the first conduit, wherein the first connection member comprises the manifold assembly coupled to a plurality of heat pipes of the cold plate.

12. The cooling system of claim 1, wherein the drive system comprises a cabinet including a plurality of slices, the cabinet including:
   a first portion having a plurality of cube chambers each having a protective enclosure in which to house a corresponding one of a plurality of power cubes, each of the plurality of power cubes including a second portion to accommodate at least a portion of the cooling system.

13. The cooling system of claim 12, wherein the cabinet comprises the heat exchanger, the heat exchanger configured to receive a flow of water coolant from an external heat exchanger and to cool the vapor phase coolant with the water coolant and to provide heated water coolant back to the external heat exchanger.

14. The cooling system of claim 13, wherein the cabinet comprises a NEMA-4 enclosure.

15. A cooling system for a drive system comprising:
   a cold plate configured to receive a flow of liquid coolant and to output a flow of vapor phase coolant, the cold plate including at least one heat pipe adapted therein to provide for transfer of the liquid coolant to the vapor phase coolant;
   a first manifold coupled to the cold plate;

a first flexible conduit coupled to the first manifold, the first flexible conduit extending vertically to enable the liquid coolant and the vapor phase coolant to travel through the first flexible conduit; and a heat exchanger located above and coupled to the first flexible conduit, wherein the heat exchanger is to transfer the vapor phase coolant to the liquid coolant, and the vapor phase coolant and the liquid coolant to travel passively through the cold plate, the first manifold, the first flexible conduit and the heat exchanger.

16. The cooling system of claim 15, wherein the cold plate comprises a plurality of heat pipes each including a channel adapted to communicate the liquid coolant along a path to enable heat exchange with a switching device coupled to the corresponding cold plate.

17. The cooling system of claim 15, wherein the at least one heat pipe comprises a wick structure to communicate the liquid coolant.

18. The cooling system of claim 15, wherein the first flexible conduit comprises a wick structure axially adapted in the first flexible conduit to communicate the liquid coolant from the heat exchanger.

19. A medium voltage drive system comprising:

at least one transformer having at least one primary winding to receive power from a utility connection and at least one secondary winding;

a plurality of power cubes each coupled to the at least one secondary winding and including a rectifier, a DC-link, and an inverter, wherein each power cube includes at least one cold plate coupled to one or more switching devices of the inverter, and a port; and a manifold assembly coupled to the at least one cold plate of the plurality of power cubes;

a first flexible conduit coupled to the manifold assembly, the first flexible conduit extending vertically to enable liquid coolant and vapor phase coolant to travel through the first flexible conduit; and a heat exchanger located above and coupled to the first flexible conduit, wherein the heat exchanger is to transfer the vapor phase coolant to the liquid coolant, wherein the liquid coolant and the vapor phase coolant is to passively flow.

* * * * *